United States Patent [19]

Balakrishnan et al.

[11] Patent Number: 5,731,983

[45] Date of Patent: Mar. 24, 1998

[54] METHOD FOR SYNTHESIZING A SEQUENTIAL CIRCUIT

[75] Inventors: Arunkumar Balakrishnan, Santa Clara, Calif.; Srimat T. Chakradhar, North Brunswick, N.J.

[73] Assignee: NEC USA, Inc., Princeton, N.J.

[21] Appl. No.: 581,417

[22] Filed: Dec. 29, 1995

[51] Int. Cl.[6] .......................... G06F 17/50; G06F 17/10; G06F 15/00

[52] U.S. Cl. .......................... 364/489; 364/488; 364/490; 364/491

[58] Field of Search .......................... 364/488–491; 371/27

[56] References Cited

U.S. PATENT DOCUMENTS

| | | | |
|---|---|---|---|
| 5,416,721 | 5/1995 | Nishiyama et al. | 364/491 |
| 5,502,646 | 3/1996 | Chakradhar et al. | 364/489 |
| 5,502,647 | 3/1996 | Chakradhar et al. | 364/489 |
| 5,513,118 | 4/1996 | Dey et al. | 364/490 |
| 5,513,123 | 4/1996 | Dey et al. | 364/489 |
| 5,522,063 | 5/1996 | Ashar et al. | 395/500 |
| 5,550,714 | 8/1996 | Nishiyama | 364/490 |
| 5,574,734 | 11/1996 | Balakrishnan et al. | 371/27 |

OTHER PUBLICATIONS

Dey et al. ("Synthesizing Designs with Low-Cardinality Minimum Feedback Vertex Set for Partial Scan Application," IEEE on VLSI Symposium, 1994, pp. 2–7 1994.

S.T. Chakradhar et al, "An Exact Algorithm for Selecting Partial Scan Flip–Flops," 31st ACM/IEEE Design Automation Conf. Proceedings, Jun. 1994, pp. 81–86.

S.T. Chakradhar and S. Dey, "Resynthesis and Retiming for Optimum Partial Scan," 31st ACM/IEEE Design Automation Conf. Proceedings, Jun. 1994, pp. 87–93.

P. Pan and C.L. Liu, "Partial Scan with Pre-selected Scan Signals," 32nd Design Automation Conference Proceedings, Jun. 1995, pp. 189–194.

*Primary Examiner*—Gary Chin
*Assistant Examiner*—Phallaka Kik
*Attorney, Agent, or Firm*—Jeffery J. Brosemer

[57] ABSTRACT

A method of circuit synthesis which considers all circuit configurations that can be designed utilizing a retiming with logic duplication (RLD) methodology. These circuit configurations (RLD configurations) each have significantly different area, performance and testability characteristics and are represented as a set of feasible solutions to an integer linear program (ILP). The ILP permits the evaluation of different design and testability metrics for each of the configurations. An approach to solve several useful special cases of the ILP in polynomial time and an application of RLD transformation to partial scan is shown. Using this method, a desired RLD configuration is produced having a minimal number of duplicated logic nodes.

3 Claims, 4 Drawing Sheets

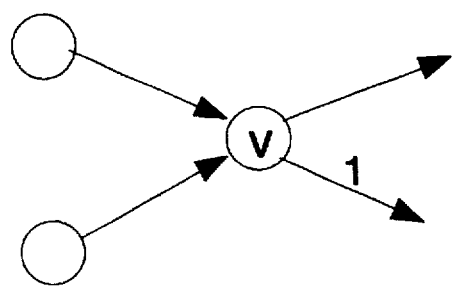
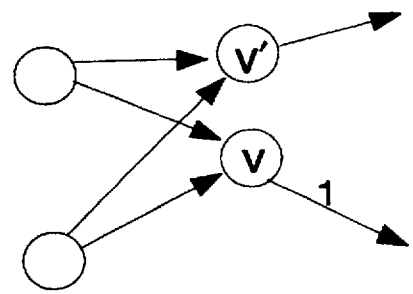
Figure 4(a)  Figure 4(b)
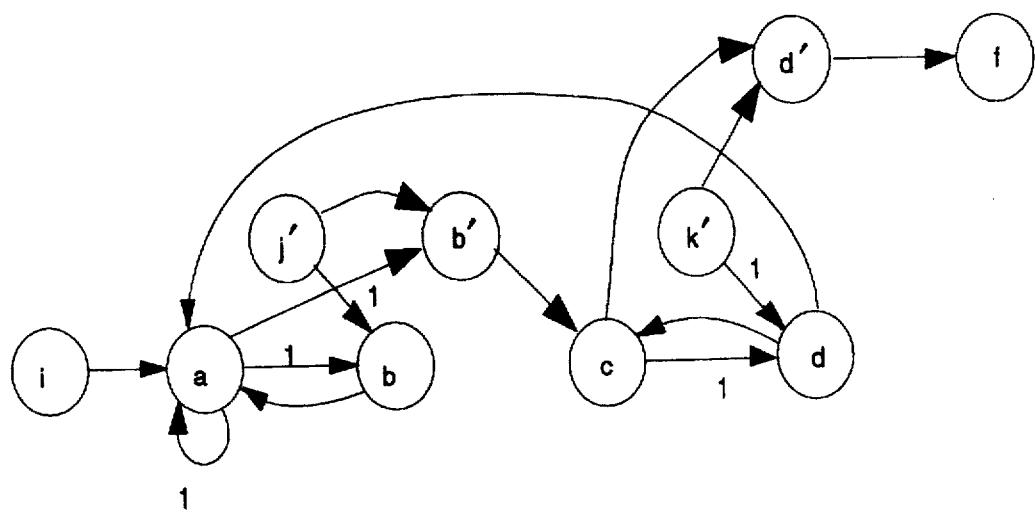
Figure 5

METHOD FOR SYNTHESIZING A SEQUENTIAL CIRCUIT

TECHNICAL FIELD

This invention relates to the field of sequential circuit design and in particular to a method for designing sequential circuits utilizing retiming with logic duplication as a single synthesis transformation technique.

DESCRIPTION OF THE PRIOR ART AND PROBLEM

Circuit transformations are an integral part of a present-day circuit synthesis process. In particular, combinational logic transformations have been utilized as a technique to minimize the area required to implement a Boolean function and also improve the performance of the circuit.

Retiming is a technique that repositions flip-flops in a circuit to obtain a functionally equivalent circuit. Retiming changes the combinational logic of a sequential circuit thereby allowing one to consider different combinational logic configurations for resynthesis. Resynthesis has been used in conjunction with retiming for sequential circuits to improve the performance and minimize the area of the circuit.

By way of background, consider the sequential circuit shown in FIG. 1(a) and corresponding flip-flop dependency graph (S-graph) shown in FIG. 2(a). The S-graph shown in this Figure has one vertex for every flip-flop in the circuit and an arc drawn from one vertex to another if a combinational path between the corresponding flip-flops exists. An effective way of selecting flip-flops for a partial scan is to select a subset of flip-flops that will break all feedback cycles. This is equivalent to a problem of selecting a set of vertices in the S-graph whose removal makes the graph acyclic, which has been referred to as the minimum feedback vertex set (MFVS) problem by S. T. Chakradhar, A. Balakrishnan, and V. D. Agrawal in an article entitled "An Exact Algorithm for Selecting Partial Scan Flip-Flops" which appeared in Proceedings of the 31st ACM/IEEE Design Automation Conference, pp. 81–86, June 1994. The MFVS problem belongs to a class of problems known in the art as NP-hard problems.

The size of the MFVS for the S-graph shown in FIG. 2(a) (not considering self-loops) is two: either X & Y; Y & Z or X & Z. By scanning flip-flops corresponding to vertices in the MFVS, all feedback cycles except self-loops are broken. The circuit is represented as a graph having one vertex for every gate in the circuit. Additionally, if gate x has a fanout to gate y, then there is drawn an arc from vertex x to vertex y. A feedback cycle in the circuit will likewise be a feedback cycle in the graph. Therefore, MFVS refers to the minimum number of vertices that have to be removed from the graph to eliminate all feedback cycles.

Now, consider the circuit shown in FIG. 1(b). This circuit was obtained by a Retiming with Logic Duplication (RLD) transformation of the circuit in FIG. 1(a). Note that logic gates b and d have been duplicated (into $b'$ and $d'$) by this transformation and that the flip-flops are repositioned. The corresponding S-graph is shown in FIG. 2(b). The size of the MFVS for this S-graph is one, namely T or Q. This example shows how the RLD transformation can be used to design equivalent circuits which require fewer scan flip-flops.

A partial scan approach attempts to select flip-flops to break feedback cycles in the circuit. This is analogous to selecting a set of vertices in the S-graph whose removal makes the S-graph acyclic (MFVS problem). While traditional, prior art partial scan methods fix the position of the flip-flops, recent approaches have attempted to reposition the flip-flops before scan selection. This technique often results in the reduction of the size of the MFVS for the resulting S-graph and hence, in the size of the scan selection.

Recently, S. T. Chakradhar and S. Dey in an article entitled "Resynthesis and Retiming for Optimum Partial Scan", in *Proc. of the 31st ACM/IEEE Design Automation Conf.*, pp. 87–93, June 1994, described using an RLD transformation to reduce the size of the scan selection. The method disclosed therein proceeds as follows. First, an MFVS for the circuit graph, referred to as the CMFVS, is computed. Second, an RLD transformation is performed to position a flip-flop at each one of the CMFVS vertices. Finally, the scan selection for the transformed circuit is given by the MFVS of the resulting S-graph. While the method disclosed in this article does effectively transform a circuit, the method suffers from a serious infirmity, namely it fails to minimize the number of logic nodes duplicated thereby producing an overly-complex transformed circuit.

More recently, P. Pan and C. L. Lin in an article entitled "Partial Scan with Pre-Selected Scan Signals", which appeared in *Proc. of the 32nd ACM/IEEE Design Automation Conference.*, June, 1995, proposed a method in which the number of logic nodes duplicated is minimized. Their approach however, has proven unsatisfactory because it requires the solving of an NP-hard problem which exhibits an exponential, worst case complexity. Therefore, a continuing need exists in the art for methods which solve the above problems and enhance the design of sequential circuits.

SOLUTION AND SUMMARY OF THE INVENTION

The above problems are solved and an advance is made over the art according to our invention whereby a sequential circuit is synthesized utilizing a retiming with logic duplication (RLD) methodology. The method advantageously considers all circuit configurations that can be designed with the RLD methodology. These circuit configurations (RLD configurations) each have significantly different area, performance and testability characteristics and are represented as a set of feasible solutions to an integer linear program (ILP). The ILP permits the evaluation of different design and testability metrics for each of the configurations.

Specifically, the present invention operates by 1) Constructing a circuit graph of the sequential circuit; 2) determining a circuit minimum feedback vertex set (CMFVS) that breaks a desired set of cycles; 3) translating the CMFVS to a circuit minimal feedback arc set (CmFAS—the D set); and; 4) determining a retiming with logic duplication transformation (RLD) that satisfies the D set.

Viewed from one aspect, the method provides an optimal solution to sequential circuit design problems. Viewed from another aspect, the method provides a framework in which to treat RLD transformations in a formal manner. Further features and advantages of the present invention, as well as the structure and operation of various embodiments of the present invention are described in detail below with reference to the accompanying drawings.

BRIEF DESCRIPTION OF THE DRAWINGS

The teachings of the present invention can be readily understood by considering the following detailed description in conjunction with the accompanying drawings, in which:

FIG. 2a is an S-graph of the circuit of FIG. 1a;

FIG. 3 is a circuit graph for the circuit of FIG. 1a;

FIG. 4a is a bubble diagram showing a vertex of a circuit;

FIG. 4b is a bubble diagram showing the vertex of FIG. 4a after duplication;

FIG. 5 is a transformed circuit graph of the circuit of FIG. 3a;

DETAILED DESCRIPTION

A preferred embodiment of the invention will now be described while referring to the figures, several of which may be simultaneously referred to during the course of the following description.

A circuit is an interconnection of combinational logic gates and flip-flops. It is assumed that every logic gate in the circuit is reachable from at least one primary input and likewise, reaches at least one primary output. Conventionally, the circuit is represented by a directed graph called a circuit graph which has a vertex for every primary input, logic gate and primary output. There are no vertices in the circuit graph that correspond to the flip-flops of the circuit.

Figure 3:
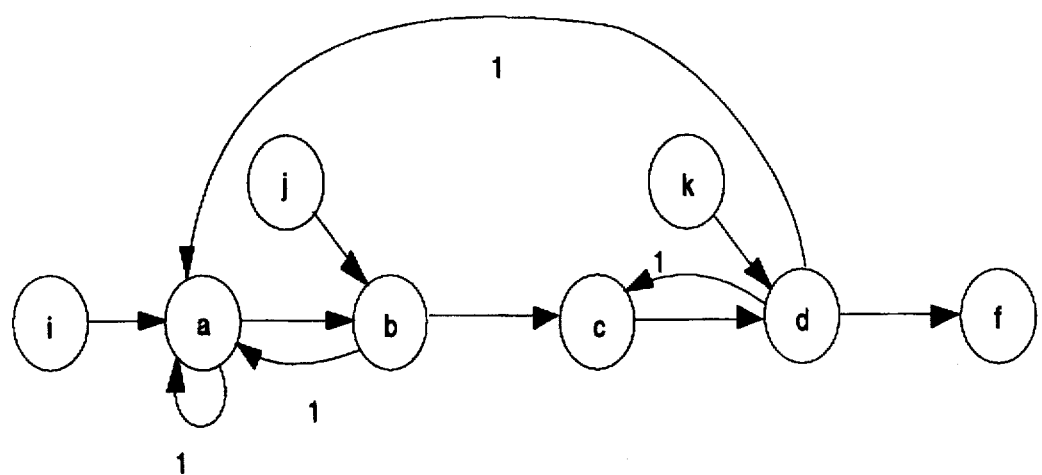

If a gate (or primary input) $g_i$ drives gate $g_j$, then there is an arc drawn from vertex $v_i$ to vertex $v_j$ on the circuit graph. A gate (or primary input) $g_i$ is one which can drive another gate $g_j$ directly or through some flip-flops. This relationship is indicated in the graph by assigning a weight on the arc $v_i \rightarrow v_j$, equal to the number of flip-flops between the corresponding gates. Multiple arcs between a pair of vertices are modified by sub-dividing the arcs with additional vertices. These additional vertices correspond to buffers. This modification is required only for modeling purposes. As an example, FIG. 3 shows a circuit graph for a circuit shown in FIG. 1 (a).

Retiming is a technique that re-positions flip-flops in a circuit to obtain a functionally equivalent circuit. This retiming technique may be viewed as a transformation on the circuit graph wherein the structure of the graph is not changed but only the arc weights are modified. This transformation is specified as an integral function r on the vertices of the circuit graph.

By way of example, consider an arc $e=(v_i \rightarrow v_j)$. Let $w(e)$ be the weight on this arc. Then $w_r(e)$, the weight on this arc after the retiming transformation, is given by $-w(e)+r(v_j)-r(v_i)$. An arbitrary integral function r is a permitted retiming transformation if it satisfies the following two conditions, R0 and R1. First, the integers associated with all primary input (PI) and primary output (PO) vertices of the circuit graph must be equal (R0). Second, all retimed arc weights must be non-negative (R1).

These two retiming conditions can be expressed as a set of linear inequalities, therefore any workable solution to the set of linear inequalities will correspond to a valid retiming of the circuit. A retiming formulation is significant because it provides a framework to explore various retiming configurations.

Conveniently, an atomic retiming step is defined to be the process of moving one flip-flop across a vertex, i.e., v. This corresponds to assigning a non-zero r value (1 or −1) to vertex v and a zero r value to all other vertices. In general, any retiming transformation r can be viewed as a sequence (partial ordering) of such atomic steps.

Logic duplication refers to the process of selectively duplicating certain logic gates in the circuit. By way of example, consider the vertex v shown in FIG. 4(a) which corresponds to a logic gate in a circuit. As shown in this Figure, it is apparent that the vertex has two incoming (fanin) arcs and two outgoing (fanout) arcs.

With reference to FIG. 4(b), v is duplicated and the duplicated vertex is shown as v'. The logic gate corresponding to vertex v' must perform the same function as the logic gate corresponding to v. Hence, the duplicated vertex v' has the same incoming arcs as that of v. Observe that the outgoing arcs of vertex v in FIG. 4(a) are now split between v and v' in FIG. 4(b).

Duplication permits a repositioning of flip-flops that is otherwise not possible. For example, the flip-flop at the output of vertex v in FIG. 4(b) can now be moved across to its incoming arcs. In other words, repositioning flip-flops, in conjunction with logic duplication results in circuit configurations that are otherwise not obtainable by retiming alone.

An atomic RLD step is defined, say for vertex v, to be an atomic retiming step with the additional possibility of duplicating vertex v. This can also be interpreted as an atomic logic duplication step followed by an atomic retiming step. The RLD transformation is then viewed as a sequence (partial ordering) of such atomic steps.

Circuit configurations obtainable by an RLD transformation are referred to as RLD configurations of the given circuit. In developing a formal framework to explore RLD configurations which is the subject of the present invention, it is first necessary to characterize some basic characteristics shared by all the RLD configurations.

In that regard, let G be a circuit graph and G' denote the transformed circuit graph corresponding to an RLD transformation t. The graph G' will contain more vertices and arcs than the original circuit graph. The extra vertices correspond to duplicated vertices and the extra arcs correspond to duplicated arcs. Furthermore, the RLD transformation alters certain structural aspects of the circuit.

A structural characterization for the RLD transformation is provided by four lemmas, namely:

1) Every path $p=v_0, v_1 \ldots, v_k$ where $v_0 \neq v_k$ in G is preserved by an RLD transformation;

2) Every cycle $c=v_0, v_1 \ldots, v_k$ where $v_0 \neq v_k$ in G is preserved by an RLD transformation;

3) Every PI-PO path and cycle in G' has a unique PI-PO path or cycle corresponding to it in G and vice-versa; and 4) The number of flip-flops in a cycle or PI-PO path is preserved by the RLD transformation.

Figure 1A:
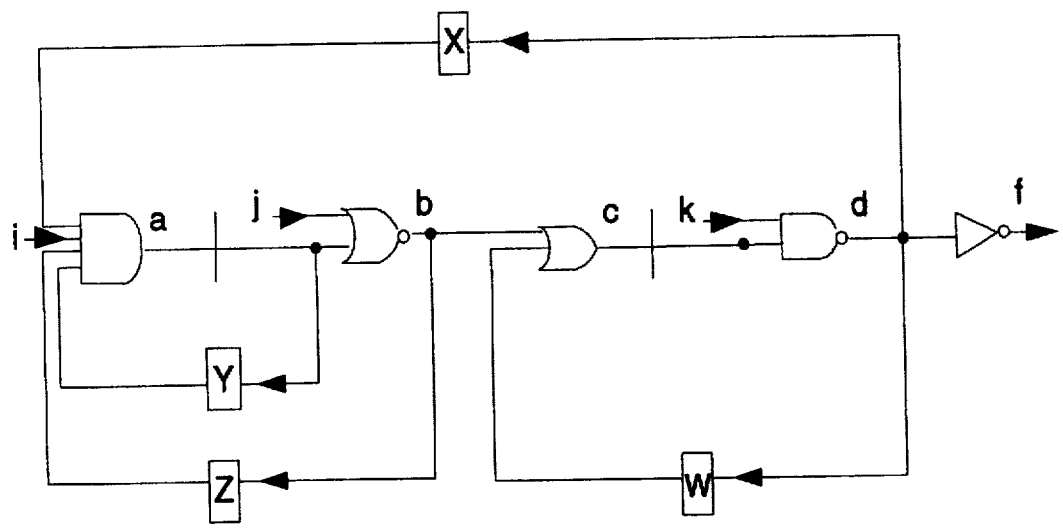
FIG. 1a is a schematic diagram of an example circuit.
Figure 1B:
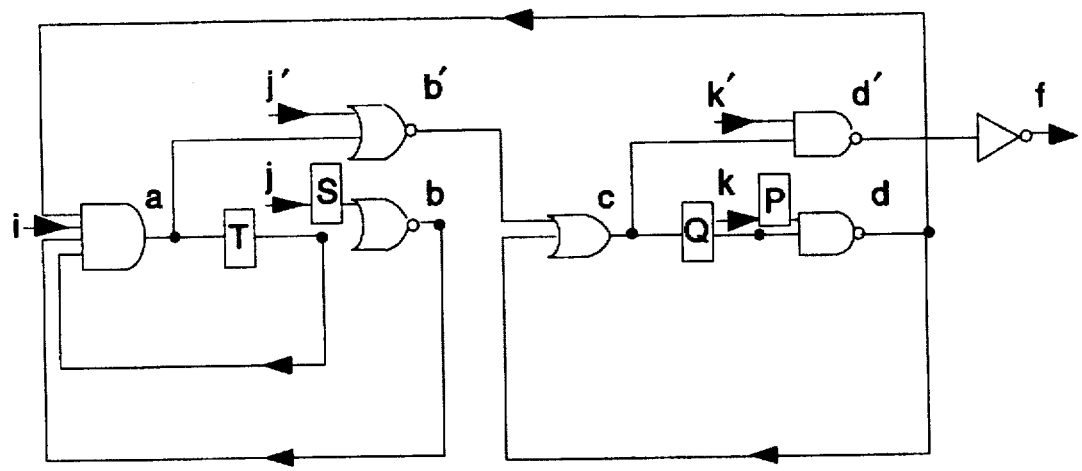
FIG. 1b is a schematic diagram of the circuit of FIG. 1a after an RLD transformation.

As stated by Lemmas [1–4], all the paths and cycles as well as the number of flip-flops on PI-PO paths and cycles are preserved during an RLS transformation Next, it may be determined whether certain flip-flop repositioning objectives can be realized by an RLD transformation. Specifically, suppose that one or more design and/or test objectives require that flip-flops be positioned at certain points in the circuit. One simple approach to this repositioning is a retiming transformation, unfortunately such a simple approach may not always be possible. The example circuit shown in FIG. 1a illustrates this point. A retiming transformation alone cannot place a flip-flop on the arc c→d. In such situations, the RLD transformation can be employed to obtain the desired flip-flop configuration.

For example, let D be the set of arcs in the circuit graph where it is desired to place a flip-flop. The arc set D can be satisfied if a flip-flop can be placed on every arc d ∈ D by a sequence of flip-flop repositioning (either atomic retiming or atomic RLD) steps. In an article entitled "Resynthesis and Retiming for Optimal Partial Scan", which appeared in *Proc. of the 31st ACM/IEEE Design Automation Conf.*, pp. 87–93, June 1994, by S. T. Chakradhar and S. Dey and another article entitled "Partial Scan with Pre-selected Scan Signals", which appeared in *Proc. of the 32nd ACM/IEEE Design Automation Conference.*, June 1995, by P. Pan and C. L. Liu, necessary and sufficient conditions for retiming alone to satisfy an arc set D were given. Those conditions are stated here by Theorem 1 as follows:

Theorem 1: Retiming (without logic duplication) can satisfy an arc set D if (a) for each PI-PO path in the graph the number of D arcs on the path does not exceed the number of flip-flops on the path and (b) for each cycle in the graph the number of D arcs on the cycle does not exceed the number of flip-flops on the cycle.

Given an arc set D it can be checked in polynomial time whether the arc set can be satisfied by a retiming transformation. If the arc set cannot be satisfied, then there must exist a PI-PO path or a cycle that violates the conditions of the above theorem. Now, consider the example graph shown in FIG. 3. The arc set D={a→b, c→d} cannot be satisfied by retiming alone because the PI-PO path i→a→b→c→d→f has no flip-flops whereas it has two D arcs. Also the cycle a→b→c→d→a has only one flip-flop but two D arcs. However, as shown in FIG. 5, this arc set can be satisfied by an RLD transformation.

Therefore, the following theorem gives us a partial characterization of when an RLD transformation can satisfy an arc set.

Theorem 2: An RLD transformation can satisfy an arc set D if there exists a partition of the arc set D such that each partition has a distinct cycle-cover;

where a cycle is said to cover a subset (partition) of the D arcs if: (i) the subset is contained in the cycle; and (ii) the size of the subset does not exceed the number of flip-flops on the cycle.

Theorem 2 provides a sufficiency condition. As an example consider the circuit graph shown in FIG. 3 and, once again the arc set a→b, c→d. A partition of this arc set that satisfies the conditions of Theorem 2 is: {a→b} in one partition and {c→d} in a second partition. The first partition is covered by the cycle a→b→a and the second partition is covered by the cycle c→d→c. Therefore, by Theorem 2 there exists an RLD transformation that will satisfy this arc set. In fact, an RLD transformation that satisfies this arc set is shown in FIG. 5.

To provide a more thorough understanding of Theorem 2, the following corollary offers a simpler, although more restricted, characterization.

Corollary 1: Any minimal feedback arc set (mFAS) of a subgraph of the circuit graph can always be satisfied by an RLD transformation.

This corollary can be readily verified in polynomial time. Furthermore, for any given arc set it is always possible to extract a minimal feedback arc set. Then, by the above corollary, there exists an RLD transformation that will satisfy at least the feedback arc set.

Consider an atomic RLD step. For example, a logic duplication splits some fanouts of a vertex away in order to move a flip-flop from other fanouts to its fanin arcs. This step can also be performed by means of another method. Instead of splitting some of the fanout arcs away, a flip-flop on these fanout arcs can be temporarily borrowed before performing the retiming step.

Figure 2A:
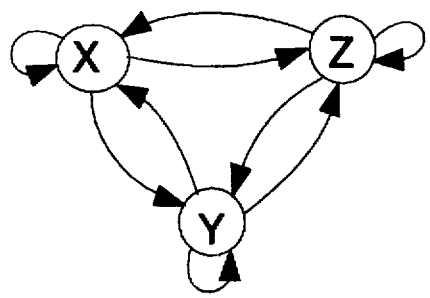
Figure 2B:
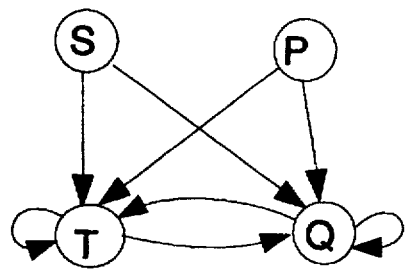
FIG. 2b is an S-graph of the circuit of FIG. 1b.

By way of example and with reference to FIG. 5, the graph shown therein was generated by performing an RLD transformation of the graph shown in FIG. 2. Here, the transformation proceeds as follows. First, a flip-flop on arc d→f is borrowed to enable $r_d=1$. Likewise, a flip-flop on arc b→c is borrowed to enable $r_b=1$. Subsequently, flip flops on arcs b→c & d→f are borrowed then vertices b and d are duplicated and the appropriate arcs are split.

This flip-flop borrowing (also referred to as negative retiming) captures the effect of logic duplication and has been used previously in other contexts (See, e.g., S. Malik, E. Sentovich, R. Brayton, and A. Sangiovanni-Vincentelli, "Retiming and Resynthesis: Optimizing Sequential Networks with Combinational Techniques", IEEE Transactions on Computer-Aided Design, Vol. 10, pp. 74–84, January 1991 and A. Balakrishnan and S. T. Chakradhar, "Software Transformations for Sequential Test Generation", Asian Test Symposium, November 1995).

Continuing on, let r be an integral function defined on the vertices and y be an integral function defined on the arcs. Then, $r(v_i)$ denotes the number of flip-flops to be moved across vertex $v_i$ and y(e) denotes the number of flip-flops borrowed on arc e. For the example graph shown in FIG. 5, the RLD transformation can be represented as y(d→f)=1, y(b→c)=1, $r_d=1$, $r_b=1$ with all other values equal to zero.

Now, consider an arc e=($v_i$→$v_j$) with weight w(e). Let $w_t(e)$ denote the weight on this arc after an RLD transformation. The transformed arc weight is computed as $$w_t(e)=w(e)+y(e)+r(v_j)-r(v_i)$$

Additionally, let P denote the set of peripheral vertices (primary inputs and primary outputs) and let $v_0$ be one such vertex. Further, let Q denote the set of arcs out of primary input vertices and also, the arcs out of vertices with fanout one. A first set of sufficiency conditions can then be stated as follows:

[T0] The [r,y] values are required to be non-negative and integral. In particular, y is Boolean and y(e)=0∀e ∈ Q.

[T1] The r values associated with all the PI and PO vertices in the circuit graph must be equal.

[T2] The transformed arc weights $w_t(e)$ must be non-negative ∀e.

[T3] For each vertex at least one outgoing arc must have y(e)=0.

First, observe that the retiming transformation satisfies the above conditions. This is because the conditions T1 & T2 are similar to the retiming conditions R0 & R1 recited previously. In this regard, note that condition T0 (the non-negativity requirement) is not really a restriction. For any given retiming transformation (r values) the r values may always be scaled to get an equivalent set of r values that is non-negative. In condition T0, y(e)=0∀e ∈ Q is enforced because arcs out of primary input vertices cannot borrow flip-flops (primary input vertices cannot be duplicated) and, arcs out of vertices with fanout one cannot borrow flip-flops. Likewise, condition T3 enforces the fact that flip-flops cannot be borrowed on all the outgoing arcs of a vertex.

These conditions are, however, are not complete because they include some degenerate cases that cannot be translated to a valid RLD transformation. For example, y(u→v)=1 for some arc u→v and all other r and y values zero for a graph (circuit) is a degenerate case. A second set of conditions rectifies such cases.

For the second set of conditions, another Boolean function c defined on the vertices of the circuit graph is required. The c values are used to denote whether a vertex is to be duplicated. The second set of conditions are as follows:

$c(v_i)=0 \ \forall \ v_i \in P.$  [C0]

$c(v_i) \geq y(v_i \rightarrow v_j) \ \forall \ v_i \rightarrow v_j.$  [C1]

$c(v_i)+w(e)+r(v_j)-r(v_i) \geq c(v_j) \ \forall \ e.$  [C2]

Since the PI and PO vertices cannot be duplicated their c values are forced to zero, thereby leading to condition C0. Condition C1 ensures that if a flip-flop is borrowed on an arc $v_i \rightarrow v_j$ then $v_i$ must be duplicated and the arc $v_i \rightarrow v_j$ split away. Finally, condition C2 in conjunction with the other conditions ensures that the [r,y] values can be translated to a valid RLD transformation.

By way of example, consider further the degenerate case above. There exist no c values that will satisfy C0–C3 for this set of [r,y] values. This can be deduced if a path p is considered from some primary input s to vertex u and further assume that the weight of the path is zero and add the inequalities stipulated by C3 for the arcs on this path to get $c(s) \geq c(u)$. Since $c(u) \geq 1$ and $c(s)=0$ the desired result is obtained.

The conditions [T0–T3] and [C0–C2] given above can be stipulated as a set of linear inequalities.

$\forall \ v_i \in P-v_0 \ r(v_0)-r(v_i) \geq 0 \ r(v_i)-r(v_0) \geq 0$  (a)

$\forall \ e \ w(e)+y(e)+r(v_j)-r(v_i) \geq 0$  (b)

$\forall \ v_i$ with fanout $k>1 \ \Sigma_{e \in \delta^+(v_i)} y(e) \leq k-1$  (c)

$\forall \ (v_i \rightarrow v_j) \ c(v_i)-y(v_i \rightarrow v_j) \geq 0$  (d)

$\forall \ e \ c(v_i)+w(e)+r(v_j)-r(v_i) \geq c(v_j)$  (e)

$y(e)=0 \forall e \in Q, y(e) \leq 1$  (f)

$c(v_i)=0 \forall v_i \in P, \ c(v_i) \leq 1$  (g)

r,y,c integral r,y,c $\geq 0$

Constraint set (a) enforces condition T1. Here, $v_0$ is a reference vertex selected from P. The next two sets of constraints, (b) and (c) enforce condition T2 and T3 respectively. The constraints enforcing T3 are referred to as the fanout inequalities. The constraints for conditions C0–C2 are repeated as is. Note that y and c values are forced to be Boolean because of the inequalities $y(e) \leq 1$ and $c(e) \leq 1$. This Integer Linear Program (ILP) formulation, however, has one major drawback—unlike the retiming formulation the constraint matrix for this formulation does not satisfy a totally unimodular property as discussed by C. H. Papadimitriou and K. Steiglitz, in *Combinatorial Algorithms and Complexity*, Prentice-Hall, Englewood Cliffs, N.J. 1982. Hence, the linear programming relaxation of this formulation, wherein the integrality requirement is dropped, will not necessarily yield integral solutions. It is the fanout inequalities which are responsible for the loss of this property.

Nevertheless, it is possible to avoid the use of fanout inequalities and thereby, overcome this drawback. In the ILP formulation a y variable was associated with all of the arcs of the circuit graph and then enforced condition T3 by means of inequalities. Instead, a set of arcs S can be selected such that for each vertex with fanout >1, at least one of its fanout arcs is not in S. Now if y variables are allowed only for the arcs in S then condition T3 will be satisfied by default. In other words, the fanout inequalities are not required. The ILP formulation, therefore reduces to the following Linear Program (LP) formulation.

$\forall \ v_i \in P-v_0 \ r(v_0)-r(v_i) \geq 0 \ r(v_i)-r(v_0) \geq 0$ $\forall \ e$ without $y(e \notin S) \ w(e)+y(e)+r(v_j)-r(v_i) \geq 0$ $\forall \ e$ with $y(e \in S) v_{i,w}(e)+y(e)+r(v_j)-r(v_i) \geq 0$ $\forall \ (v_i \rightarrow v_j) \ c(v_i)-y(v_i \rightarrow v_j) \geq 0$ $\forall \ e \ c(v_i)+w(e)+r(v_j)-r(v_i) \geq c(v_j)$ $y(e)=0 \forall v_i \in Q, \ y(e) \leq 1$ $c(v_i)=0 \forall v_i \in P, \ c(v_i) \leq 1$ r,y,c $\geq 0$ The four lemmas described previously can now be supplemented with a fifth, namely lemma 5 which states:

5) The constraint matrix of the formulation given above has the totally unimodular (TUM) property.

Since the constraint matrix satisfies the TUM property, the integrality requirement is dropped. By choosing different S arcs, different LP formulations are obtained. All of these formulations can be viewed as special cases of the ILP formulation. In addition to possessing the TUM property, all these formulations also possess the network structure and hence, can be solved efficiently by network flow algorithms.

Note that the LP formulation as derived above requires that the arcs (S set) for allowed y variables must be a-priori chosen. This, however, is not a severe restriction. Oftentimes, a superset of the arcs where the transformation will borrow flip-flops can be identified. Moreover, since the LP formulation can be solved very efficiently it can be used iteratively allowing different S sets for different iterations. This therefore, provides a powerful method (framework) to explore the space of RLD configurations.

Given [r,y] values that satisfy the conditions described previously, the following procedures will compute the corresponding transformed graph. First, a back_dfs procedure is used to mark the vertices and arcs that have to be duplicated. Then the arcs of the transformed graph are created (added) one at a time.

```
Procedure back_visit(v)
    mark(v) = 1;
    for each arc ω → v {
        if (ω_L(ω → v) = 0 and mark(ω) = 0){
            mark(ω → v) = 1;
            back_visit(ω);
        } else if (w_i(ω → v) = 0){
            mark(ω → v) = 1;
        }
    }
    return;
Procedure back_dfs
    for (each vertex ω with y(ω → v) = 1$){
        back_visit(ω);
    }
    return
```

```
Procedure transform_graph
back_dfs;
  for each arc ω → v ∈ G
    if (y(ω → v) = 1){
      add-arc(ω' → v, ω₁(ω → v));
      if (mark(v))
        add-arc(ω' → v',ω₁(ω → v) - 1);
    } else {
      add-arc(ω → v,ω₁(ω → v));
      if (mark(ω → v))
        add-arc(ω' → v,ω₁(ω → v));
      else if (mark(v))
        add-arc(ω → v',ω₁(ω → v) - 1$);
    }
  }
  return(G');
```

Note that the above procedures do not need the c values. Notwithstanding, when the c values are given and assuming that they are minimal, the mark values are given by: mark $(v)=c(v) \forall$ v and mark$(w \rightarrow v)=1$ if $c(w)=c(v)=1$ and $w(e)+r(v)-r(w)=0$.

As previously discussed, prior art methods utilized RLD transformations to attain a significant reduction in scan selection. The method utilized in the prior art proceeded as follows: First, an MFVS for a circuit graph, referred to as the CMFVS was computed. Then an RLD transformation was employed to position a flip-flop at each one of the CMFVS vertices. Finally, the scan selection for the transformed circuit was given by the MFVS of the resulting S-graph.

In sharp contrast to the prior art, the method of the present application computes the RLD transformation that satisfies the CMFVS. The method advantageously minimizes the number of logic nodes duplicated. According to the method, the problem of satisfying the CMFVS is equivalent to the problem of satisfying an arc set D. The D set consists of all outgoing arcs of the CMFVS vertices and is called the Circuit minimal Feedback Arc Set (CmFAS). It is important to note that the arc set may have to be modified (reduced) to ensure minimality. Recall that by Corollary 1, such an arc set can always be satisfied by an RLD transformation.

The method which is the subject of the present application that generates an RLD transformation utilizes an interesting structural property (SCC Layering) of this type of problem which may be illustrated through the use of an example. Consider the circuit graph shown in FIG. 3. One possible MFVS (CMFVS) for this graph is $\{a,c\}$. The CmFAS associated with this CMFVS is $\{a \rightarrow b, c \rightarrow d\}$. Note that it is not necessary to include the self-loop $a \rightarrow a$ and that the CmFAS arcs will always belong to strongly connected components (SCC's) of the circuit graph.

At this point, those skilled in the art may recognize that to satisfy an arc belonging to the CmFAS it is sufficient to borrow flip-flops from the arcs that go out of the SCC, such as $v_i \rightarrow v_j$ where $v_i \in SCC$ and $v_j \notin SCC$.

Once again consider the graph shown in FIG. 3 which has a single SCC - $\{a,b,c,d\}$. The arc that goes out of this SCC is $d \rightarrow f$. Note, that a flip-flop is needed on this arc in order to satisfy $\rightarrow d$. First, a determination is made to see if a flip-flop can be placed on $d \rightarrow f$ by retiming. If not, a flip-flop on this arc is borrowed and $c \rightarrow d$ is satisfied. Note that it is not possible to satisfy both the arcs of the CmFAS in one iteration. Since the arc $c \rightarrow d$ is satisfied, this arc is deleted from the graph and the SCC's of the graph are recomputed. The SCC of the modified graph is $\{a,b\}$. The arc that goes out of this SCC is $b \rightarrow c$. Once again, a determination is made to see if a flip-flop can be placed on this arc by retiming. If not, a flip-flop on this arc is borrowed and $a \rightarrow b$ is satisfied.

The combined transformation is given by $r_d = r_b = 1$, $y(b \rightarrow c) = y(d \rightarrow f) = 1$. All the other values are zero. The transformed circuit graph is shown in FIG. 5. Note that in the course of satisfying these two arcs the SCC's and the arcs that go out of these SCC's in layers were examined (hence, the term SCC Layering). The SCC's uncovered in this example were $-\{a,b,c,d\}$ and $\{a,b\}$.

Figure 6A:
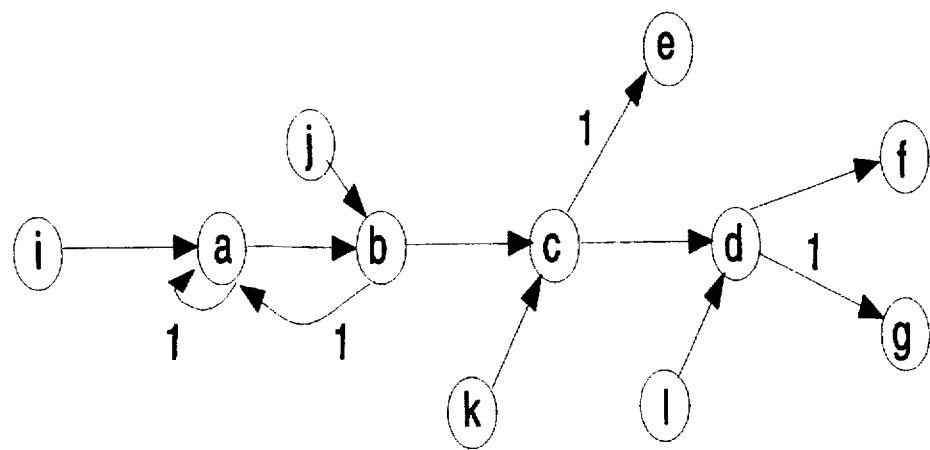
FIG. 6a is a circuit graph for an example circuit.
Figure 6B:
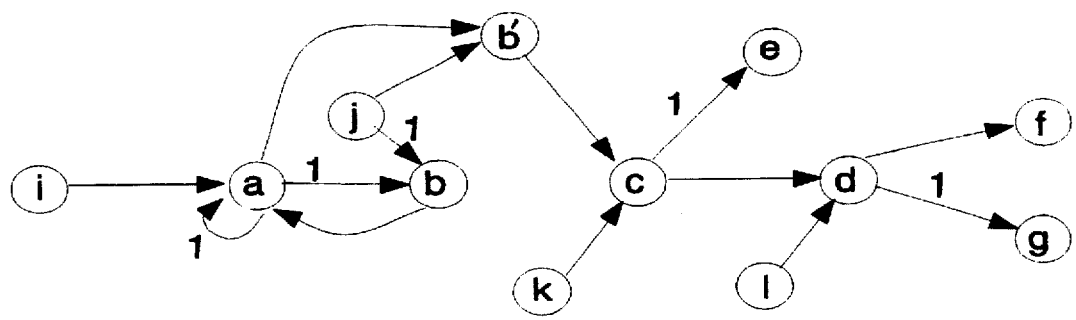
FIG. 6b is a transformed circuit graph of the circuit graph of FIG. 6a generated according to a method of the present invention.
Figure 7:
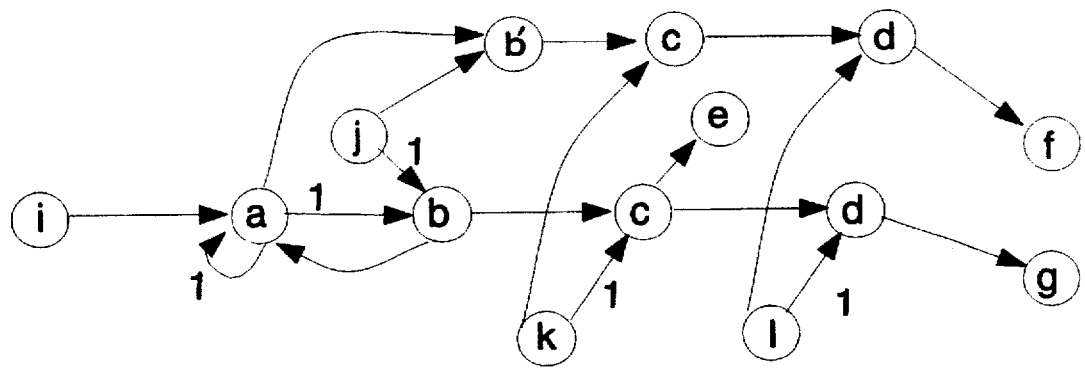
FIG. 7 is a transformed circuit graph of the circuit graph of FIG. 6a generated according to a prior art method.

By means of a final example and with reference to FIG. 6, it can be shown why it is important to borrow only from arcs that go out of an SCC and not from an arc that is (far) away from SCC's. The CMFVS for this graph is vertex a. The CmFAS associated with this CMFVS is arc $a \rightarrow b$. Once again, the SCC's are computed. For this example the SCC is $\{a,b\}$. The arc that goes out of the SCC is $b \rightarrow c$. First a determination is made whether a flip-flop can be placed on the arc $b \rightarrow c$ by retiming. If not, a flip-flop on this arc is borrowed and $a \rightarrow b$ is satisfied. The resulting circuit graph is shown in FIG. 6(b). In sharp contrast the transformed graph computed by the prior art method given is shown in FIG. 7. This prior art transformation borrows a flip-flop on arc $d \rightarrow f$ which is away from an SCC. The number nodes duplicated in FIG. 6(b) is 1 whereas it is 3 in FIG. 7.

Therefore, the method used in the above examples can be generalized as follows:

(a) satisfy as many arcs as possible by borrowing flip-flops only on arcs that go out of the SCC's.

(b) delete the satisfied arcs and recompute the SCC's and (c) repeat the above steps until all arcs are satisfied.

Step (a) can be solved by using the LP formulation described previously. Observe that the set of arcs that go out of an SCC trivially satisfy condition $\{T3\}$. Hence, in each iteration these arcs are allowed to have y variables.

Finally, given a sequential circuit (circuit graph) a circuit minimum feedback vertex set (CMFVS) that breaks the desired set of cycles is computed using the algorithm described. The CMFVS is then translated to a circuit minimal feedback arc set (CmFAS), the $\{D\}$ set. The following procedure TROPS (transformations for a partial scan) computes the RLD transformation that will satisfy the D arcs.

```
Procedure TROPS(G,D)
  while (D not satisfied){
    compute_SCC's;
    if (removed arcs)
      add_removed_arcs;
    mark_yarcs;
    if (d ∈ D is satisfied and d ∈ SCC)
      yarcs = yarcs + d;
    solve_LP(G,D,yarcs);
    transform_graph;
    if(D is not satisfied)
      remove_satisfied_arcs;
  }
  return(G');
```

According to the method, the strongly connected components (SCC's) of the circuit graph are first computed. If any arcs were removed from the graph prior to the SCC computation these are now added back. Then, all the arcs that go out of an SCC are marked as y arcs (including arcs ∈ D). These are the arcs that will be allowed to have a y variable. In addition, if any of the arcs that were removed prior to the SCC computation now belong to an arcs in D are satisfied then we are done, else we remove all the satisfied arcs and iterate the above sequence until all the arcs are satisfied.

While there has been described and illustrated a method of asynchronous circuit synthesis utilizing retiming with logic duplication, it will be apparent to those skilled in the art that modifications and variations are possible without deviating from the broad principle and spirit of the invention which shall be limited solely by the scope of the claims appended hereto.

What is claimed is:

1. A method for synthesizing a sequential circuit comprising the steps of:

constructing a circuit graph of the sequential circuit;

determining a circuit minimum feedback vertex set (CMFVS) that breaks a desired set of cycles;

translating the CMFVS to the D set;

and determining a retiming with logic duplication transformation (RLD) that satisfies the D set while minimizing the number of logic nodes duplicated.

2. A method for synthesizing a sequential circuit as set forth in claim 1 wherein said determination of the RLD transformation that satisfies the D set comprises the steps of:

(a) determining any strongly connected components (SCC's) of the circuit graph;

(b) returning to the graph any arcs which were removed prior to said determination of SCC's;

(c) identifying all arcs that go out of an SCC as y arcs;

(d) solving a linear program formulation of the graph subject to a set of contstraints;

(e) transforming the graph using the solution returned by step (d); and (f) removing all satisfied arcs and repeating steps (a) through (e) above until all satisfied arcs are removed.

3. A method for synthesizing a sequential circuit as set forth in claim 2 wherein said transforming the graph step comprises the steps of:

tagging any vertices and arcs that require duplication; and adding the arcs to the transformed graph.

* * * * *